(12) United States Patent
Nagano (10) Patent No.: US 11,280,807 B2
(45) Date of Patent: Mar. 22, 2022

(54) INSULATION RESISTANCE MEASUREMENT DEVICE AND INSULATION RESISTANCE MEASUREMENT METHOD

(71) Applicant: NHK SPRING CO., LTD., Yokohama (JP)

(72) Inventor: Ryosuke Nagano, Yokohama (JP)

(73) Assignee: NHK SPRING CO., LTD., Kanagawa (JP)

( * ) Notice: Subject to any disclaimer, the term of this patent is extended or adjusted under 35 U.S.C. 154(b) by 0 days.

(21) Appl. No.: 17/136,099

(22) Filed: Dec. 29, 2020

(65) Prior Publication Data

US 2021/0231719 A1 Jul. 29, 2021

(30) Foreign Application Priority Data

Jan. 24, 2020 (JP) .............................. JP2020-010199

(51) Int. Cl.
*G01R 1/067* (2006.01)
(52) U.S. Cl.
CPC ................................ *G01R 1/06722* (2013.01)
(58) Field of Classification Search
CPC .................................................. G01R 1/06722
See application file for complete search history.

(56) References Cited

U.S. PATENT DOCUMENTS

| 9,679,592 | B2 | 6/2017 | Kawao | |
|---|---|---|---|---|
| 2002/0070749 | A1* | 6/2002 | Tsuru | G01R 31/129 324/762.01 |
| 2019/0265305 | A1* | 8/2019 | Shin | H01M 10/488 |

FOREIGN PATENT DOCUMENTS

JP        2010032435 A        2/2010

* cited by examiner

*Primary Examiner* — Paresh Patel
(74) *Attorney, Agent, or Firm* — Holtz, Holtz & Volek PC

(57) ABSTRACT

An insulation resistance measurement device includes a jig unit, a control unit and a transfer mechanism. The jig unit includes a lower jig having a reference surface, an upper jig having an abutting surface, a probe unit and a servomotor. When the upper jig is lowered toward the lower jig by the servomotor, the probe contacts a portion to be measured. When the upper jig is lowered further and the abutting surface of the upper jig abuts the reference surface, a torque of the servomotor increases. When the torque reaches a predetermined value, an insulation resistance is measured by the probe in a state where the torque is maintained.

7 Claims, 8 Drawing Sheets

INSULATION RESISTANCE MEASUREMENT DEVICE AND INSULATION RESISTANCE MEASUREMENT METHOD

CROSS-REFERENCE TO RELATED APPLICATIONS

This application is based upon and claims the benefit of priority from prior Japanese Patent Application No. 2020-010199, filed Jan. 24, 2020, the entire contents of which are incorporated herein by reference.

BACKGROUND OF THE INVENTION

1. Field of the Invention

The present invention relates to an insulation resistance measurement device and an insulation resistance measurement method for measuring an insulation resistance of a portion to be measured of, for example, a disk drive suspension or the like.

2. Description of the Related Art

A disk drive is used in an information processing device such as a personal computer. The disk drive includes a magnetic disk which rotates about a spindle, a carriage which turns about a pivot, and the like. A disk drive suspension is disposed in an arm of the carriage.

The disk drive suspension includes a base plate, a load beam, a flexure and the like. A slider is disposed in a gimbal portion formed close to a distal end of the flexure. Elements for making accesses such as reading of data recorded on a disk and writing of data are disposed in the slider.

The flexure includes a metal base made of a thin stainless steel plate and a wiring portion formed on the metal base. The wiring portion includes a base insulating layer made of an electrically insulating material such as polyimide, a plurality of conductors made of copper and formed on the base insulating layer, and the like. One end portions of the conductors are connected to elements disposed in the slider or electronic components disposed in the flexure. The other end portions of the conductors are connected to an electronic device such as an amplifier.

An example of the conventional suspension is described in U.S. Pat. No. 9,679,592 B (Patent Literature 1). The flexure of this suspension has a flexure tail extending in the length direction. A tail pad portion is formed in an end portion of the flexure tail. Terminals (tail electrodes) for connecting an electronic circuit such as an amplifier are arranged in the tail pad portion. The insulating layer of the wiring portion is made of resin such as polyimide, and has an extremely small thickness of 2 to 20 µm. However, reliability required for the wiring portion is high, and high reliability is also required for insulation properties. Therefore, it is necessary to measure the insulation resistance of the wiring portion for all the suspensions (so-called one hundred percent test).

In order to test the insulation properties of a portion to be measured such as the wiring portion disposed in the flexure, the insulation resistance is tested using an insulation resistance measurement device in some cases. For example, one of a pair of probes is brought into contact with the terminal (tail electrode) of the tail pad portion. In addition, the other probe is brought into contact with the metal base of the flexure. The insulation resistance is measured in this way. Therefore, it is necessary to carry out probing accurately and stably. For example, as described in JP 2010-032435 A (Patent Literature 2), supplying of an airflow around a probe has been proposed for stabilization of probing.

During the measurement of the insulation resistance of the suspension, it is necessary to accurately bring the probe into contact with the portion to be measured. However, on the production line of the suspension which is an extremely small component, it is not easy to efficiently and stably bring the probe into contact with the portion to be measured. In some cases, it is affected by a change in humidity of the portion to be measured or by variations in shape, a degree of deformation or the like of the portion to be measured. Therefore, accurate measurement cannot be expected due to mixing of noise in the measurement result or the like. On the production line of the suspension, probing is carried out when the insulation resistance is measured. There has been demand for an insulation resistance measurement device which can efficiently and accurately carry out probing.

BRIEF SUMMARY OF THE INVENTION

An object of the present invention is to provide an insulation resistance measurement device and an insulation resistance measurement method which can efficiently and accurately carry out probing when measuring an insulation resistance of, for example, a disk drive suspension or the like.

An example of a workpiece is a disk drive suspension. One embodiment is an insulation resistance measurement device for measuring an insulation resistance of a portion to be measured of the workpiece. This measurement device includes a lower jig, an upper jig, a probe unit, a lifting/lowering mechanism and a control unit. The lower jib has a reference surface and a workpiece placement surface. The upper jig has an abutting surface opposed to the reference surface. The probe unit includes a probe which is disposed in the upper jig and a spring which urges the probe downward. The probe projects toward the workpiece placement surface. The lifting/lowering mechanism includes a servomotor which lowers the upper jig toward the lower jig. Then, the lifting/lowering mechanism causes the probe to contact the portion to be measured and causes the abutting surface to abut the reference surface by the servomotor. When the probe contacts the portion to be measured and the abutting surface abuts the reference surface, a torque of the servomotor increases and reaches a predetermined value. The control unit measures an insulation resistance of the portion to be measured under a state where the torque is maintained at the predetermined value.

According of this embodiment, probing during measurement can be efficiently and accurately carried out. Therefore, the insulation resistance of the workpiece such as the disk drive suspension can be efficiently and accurately measured.

An example of the workpiece is a suspension chain blank in which a plurality of suspensions are arranged with a predetermined pitch. The insulation resistance measurement device may include a transfer mechanism for moving the suspension chain blank. The transfer mechanism may include an actuator which places a tail pad portion of the suspension on the workpiece placement surface.

The probe unit may include a first probe, a first spring, a second probe and a second spring. The first probe contacts a first contact portion of the portion to be measured. The first spring urges the first probe downward. The second probe contacts a second contact portion of the portion to be measured. The second spring urges the second probe downward. When a distal end of the first probe abuts the first contact portion, the first spring is compressed. When a distal end of the second probe abuts the second contact portion, the second spring is compressed. The abutting surface abuts the reference surface in a state where the first spring and the second spring are compressed, respectively.

The workpiece placement surface of the lower jig may be located at a lower position than the reference surface. The upper jig may have a probe mounting surface located at a higher position than the abutting surface. The reference surface and the abutting surface may be each formed of a flat surface extending in the horizontal direction, and the reference surface and the abutting surface may be parallel to each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An insulation resistance measurement device according to one embodiment will be described with reference to FIGS. 1 to 7. An example of a measurement object (workpiece) is a disk drive suspension. First, an example of the disk drive suspension will be described with reference to FIGS. 3 to 11.

Figure 8:
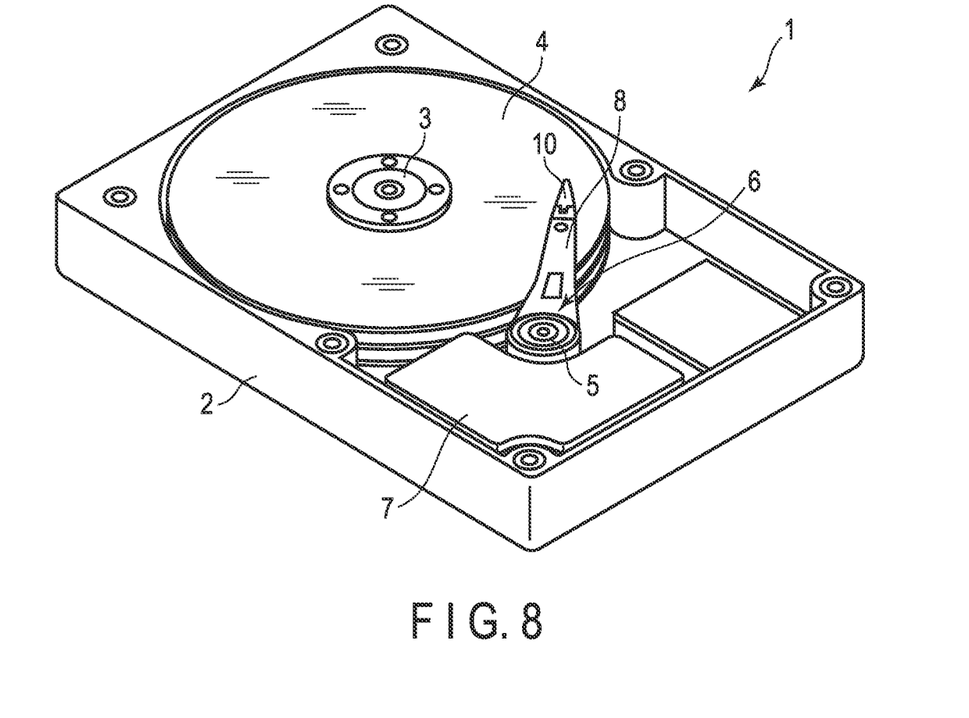
FIG. 8 is a perspective view showing an example of a disk drive.

As shown in FIG. 8, a disk drive (hard disk drive) 1 includes a case 2, a disk (magnetic disk) 4 which rotates about a spindle 3, a carriage 6 which turns about a pivot shaft 5, and a positioning motor 7 which turns the carriage 6. The case 2 is sealed by a lid which is not shown in the drawing.

Figure 9:
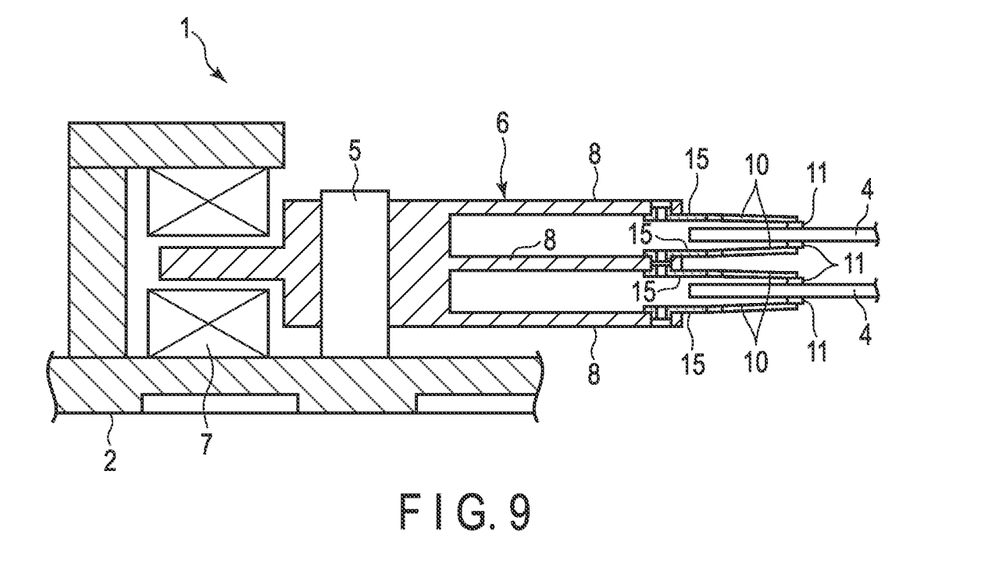
FIG. 9 is a cross-sectional view of a part of the disk drive shown in FIG. 8.

FIG. 9 is a cross-sectional view schematically showing a part of the disk drive 1. Arms 8 are disposed in the carriage 6. A suspension 10 is mounted in a distal end portion of the arm 8. A slider 11 constituting a magnetic head is disposed close to a distal end portion of the suspension 10.

When the disk 4 rotates, an air bearing is formed between the disk 4 and the slider 11. When the carriage 6 is turned by the positioning motor 7, the slider 11 moves to a desired track of the disk 4. An element for recording data on the disk 4 and an element for reading data recoded on the disk 4 are disposed in the slider 11.

Figure 10:
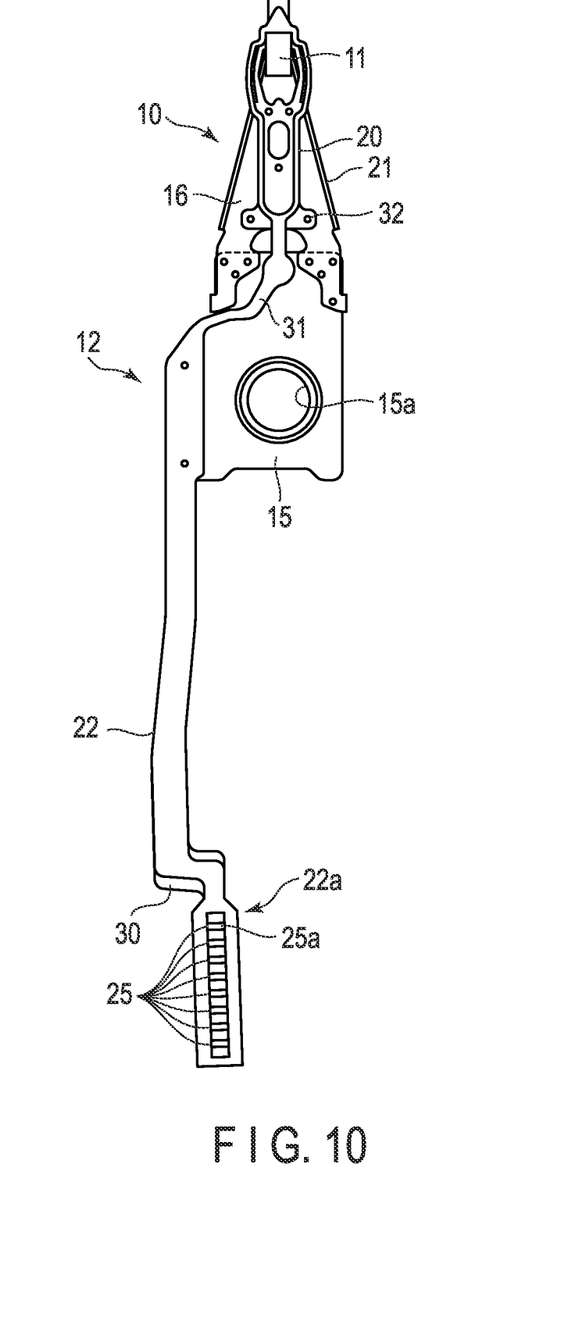
FIG. 10 is a plan view showing an example of a disk drive suspension.

A head gimbal assembly 12 shown in FIG. 10 includes the suspension 10 and the slider 11 mounted in the suspension 10. The suspension 10 includes a base plate 15, a load beam 16, a flexure 20 and the like. A boss portion 15a of the base plate 15 is fixed to the arm 8 of the carriage (shown in FIGS. 8 and 9). The load beam 16 is made of a stainless steel plate.

The flexure 20 includes a portion 21 overlapping the load beam 16, and a flexure tail 22 extending toward the back of the base plate 15. The flexure tail 22 includes a tail pad portion 22a. Terminals (tail electrodes) 25 connected to an electronic device such as an amplifier are arranged in the tail pad portion 22a.

The flexure 20 includes a metal base 30 (partly shown in FIG. 10) and a wiring portion 31 arranged along the metal base 30. The metal base 30 is fixed to the load beam 16 by a weld portion 32 such as a laser weld. The metal base 30 is also used as an electrical ground.

The wiring portion 31 includes an insulating layer made of an insulating material such as polyimide, and a plurality of conductors. The insulating layer is formed on the metal base 30. The conductors are formed on the insulating layer. One end portions of the conductors are electrically connected to elements, etc., disposed in the slider, respectively. The other end portions of the conductors are electrically conductive to the terminals 25 of the tail pad portion 22a, respectively.

Figure 11:
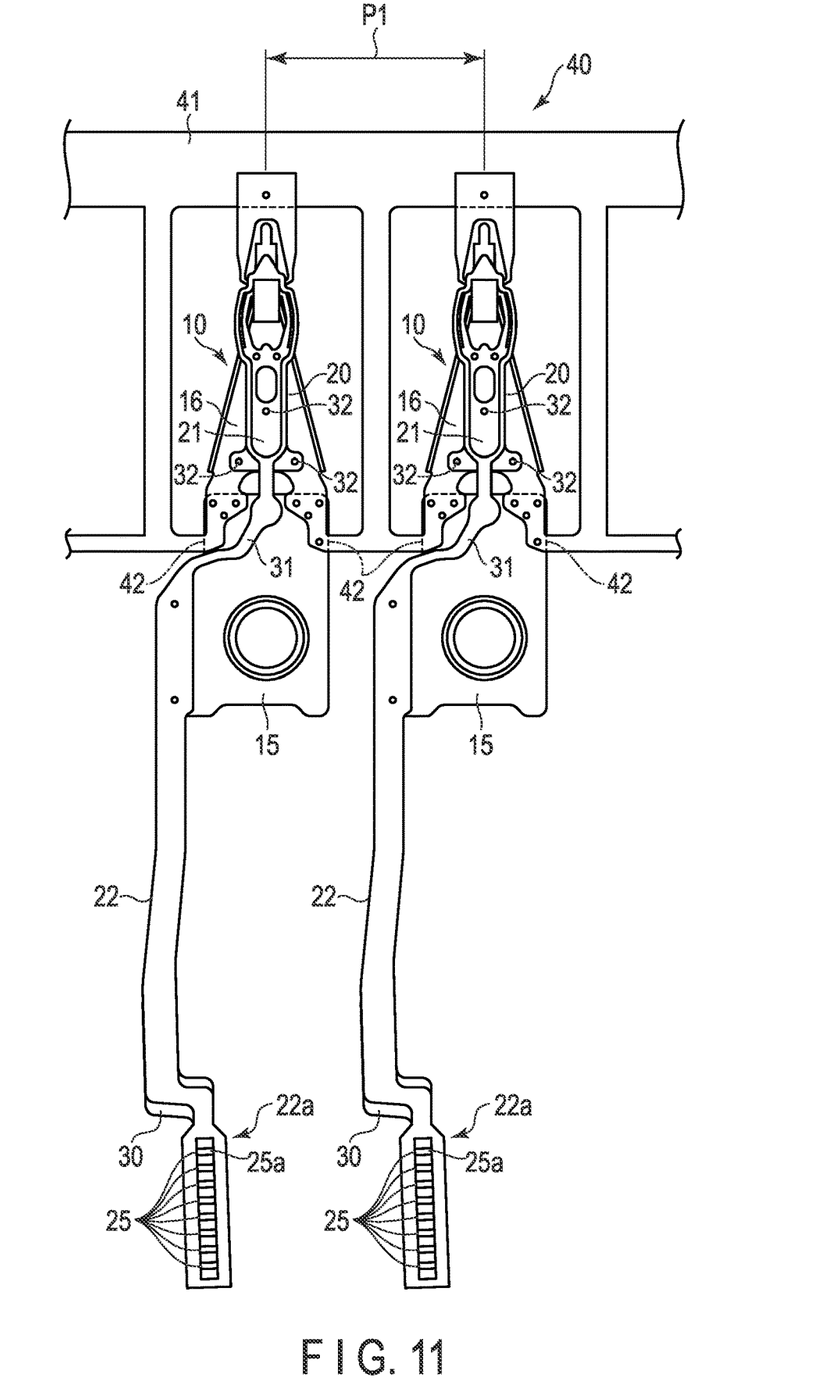
FIG. 11 is a plan view showing a part of a suspension chain blank.

FIG. 11 shows a part of a suspension chain blank 40. The suspension chain blank 40 is an intermediate product manufactured in the process of manufacturing a large number of suspensions 10. The suspension chain blank 40 includes a frame 41, the road beams 16, the base plates 15 fixed to the respective load beams 16, and the flexures 20 fixed to the respective load beams 16. The load beams 16 are arranged with a predetermined pitch in the frame 41.

The suspensions 10 disposed in the suspension chain blank 40 are arranged with a predetermined space (pitch P1) in the frame 41. The frame 41 is made of the same stainless steel plate as the load beams 16. The load beams 16 are integrally connected to the frame 41 in respective connection portions 42.

The insulation resistance of the flexure 20 disposed in the suspension chain blank 40 is tested by an insulation resistance measurement device 50 according to the present embodiment (shown in FIGS. 1 to 4). After the test, the connection portions 42 of the suspension chain blank 40 are cut by a die set. Accordingly, the suspension 10 is cut off from the frame 41.

The configuration and effect of the insulation resistance measurement device 50 of one embodiment will be described with reference to FIGS. 1 to 7. An example of the measurement object (workpiece) is the suspension 10 disposed in the suspension chain blank 40 (shown in FIG. 11). Note that the measurement object may be an electronic device other than the suspension 10.

Figure 1:
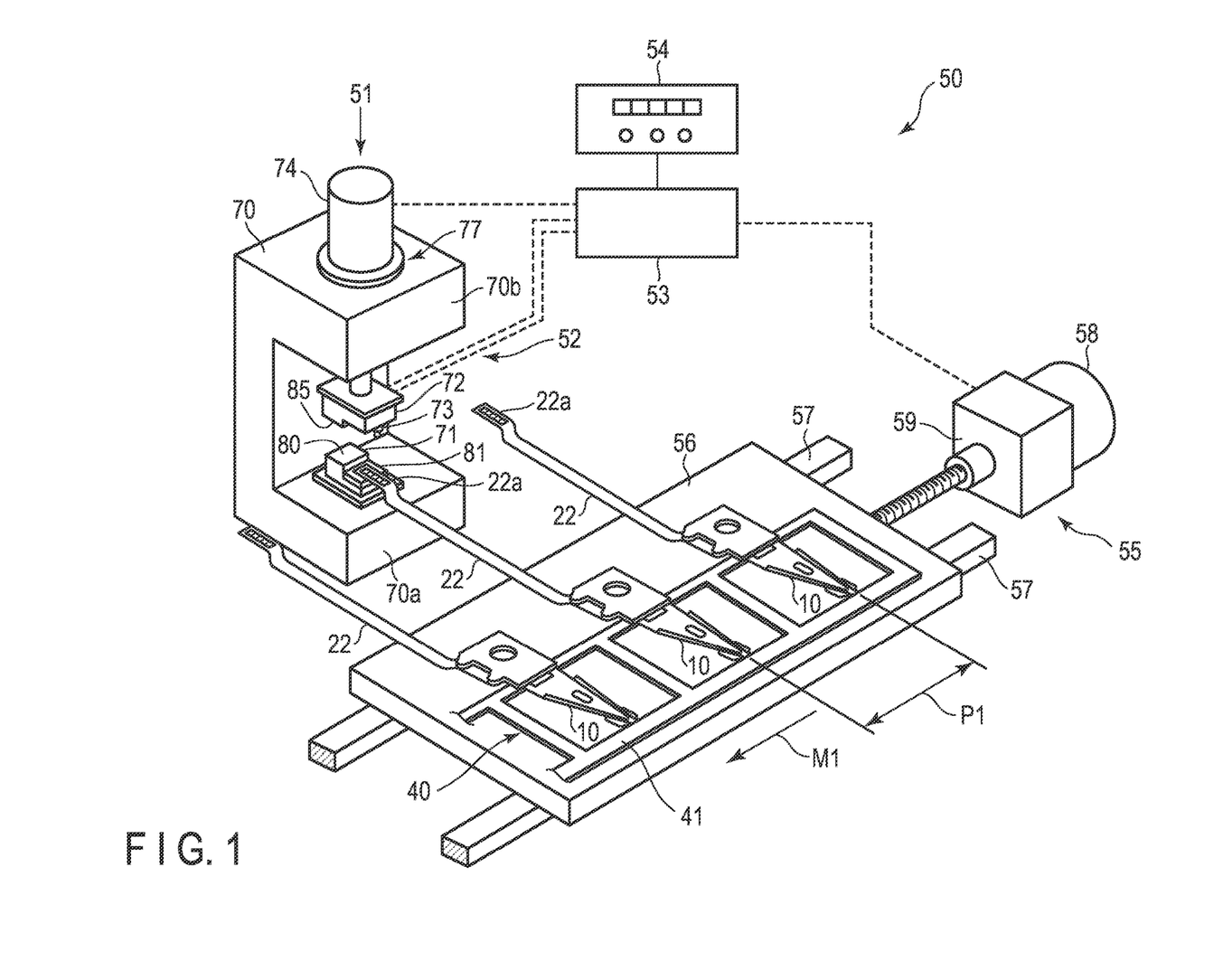
FIG. 1 is a perspective view schematically showing an insulation resistance measurement device according to one embodiment.

The insulation resistance measurement device 50 shown in FIG. 1 includes a jig unit 52 arranged on a measurement stage 51. In addition, this measurement device 50 includes a control unit 53, a display unit 54 which displays a measurement result, etc., and a transfer mechanism 55 which moves the workpiece (the suspension chain blank 40). The transfer mechanism 55 moves the suspension chain blank 40 in a direction in which the suspensions 10 are arranged (a direction indicated by an arrow M1). This transfer is intermittently carried out by the arrangement space (pitch P1) of the suspensions 10.

An example of the transfer mechanism 55 includes a workpiece support member 56, guide members 57 and an actuator 58. The suspension chain blank 40 is placed on the work support member 56. The workpiece support member 56 can hold the suspension chain blank 40 at a predetermined position. The guide members 57 extend in the direction in which the suspensions 10 are arranged (the direction indicated by the arrow M). The arrow M1 also indicates a direction in which the suspension chain blank 40 moves.

An example of the actuator 58 is a servomotor electrically controlled by the control unit 53. The actuator 58 intermittently moves the workpiece support member 56 by the pitch P1 via a force transmission mechanism 59 such as a ball screw. That is, the workpiece support member 56 moves by the pitch P1 in a direction along the guide members 57 (the direction indicated by the arrow M1).

As shown in FIG. 1, the suspension chain blank 40 includes the suspensions 10 arranged with the predetermined pitch P1. The transfer mechanism 55 intermittently moves the suspension chain blank 40 by the pitch P1. Accordingly, the tail pad portions 22a of the flexures 20 are transferred to the measurement stage 51 one by one. After the measurement of one suspension 10 ends, the suspension chain blank 40 is moved by the pitch P1. Accordingly, the tail pad portion 22a of the suspension 10 to be measured next is transferred to the measurement stage 51.

Figure 2:
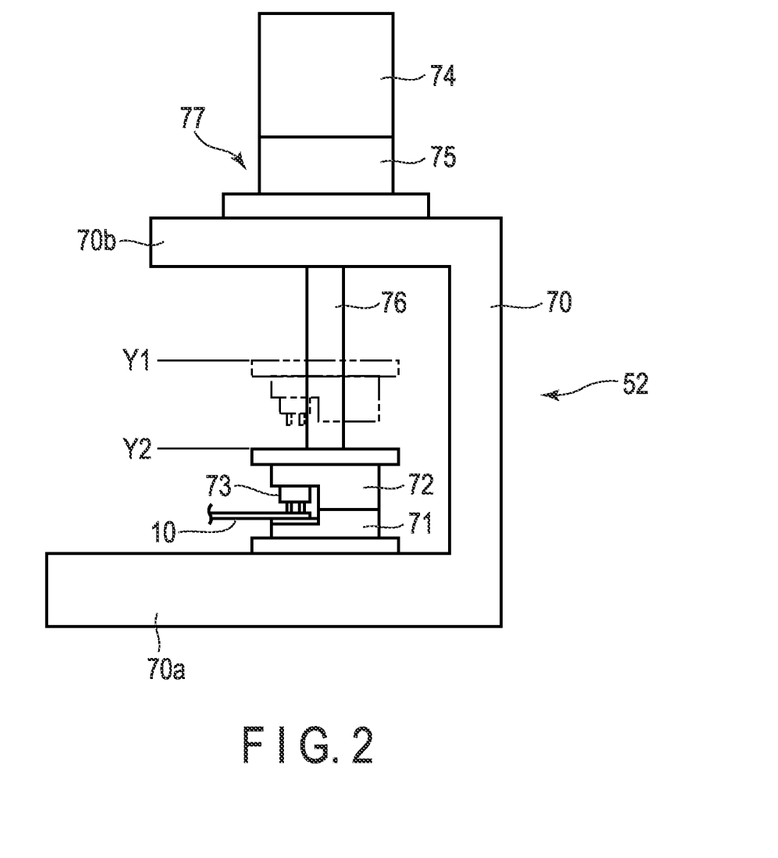
FIG. 2 is a side view of a jig unit of the insulation resistance measurement device shown in FIG. 1.

FIG. 2 is a side view of the jig unit 52. The jig unit 52 includes a frame structure 70, a lower jig 71, an upper jig 72, a probe unit 73 and a servomotor 74. The frame structure 70 constitutes the main body of the jig unit 52, and includes a lower support portion 70a and an upper support portion 70b. The lower jig 71 is arranged in the lower support portion 70a of the frame structure 70. The upper jig 72 is disposed above the lower jig 71. The probe unit 73 is disposed in the upper jig 72. The servomotor 74 is arranged in the upper support portion 70b of the frame structure 70.

As shown in FIG. 2, the upper jig 72 is moved between a retreat position Y1 on a lifting side and a pressurizing position Y2 on a lowering side by the servomotor 74. The retreat position Y1 on the lifting side is a lifting stroke end. The pressurizing position Y2 on the lowering side is a lowering stroke end. The servomotor 74 is controlled by the control unit 53 (shown in FIG. 1). The control unit 53 includes an electrical circuit configuration and a memory, etc. The servomotor 74 is rotated by electrical power and generates a torque. The torque of the servomotor 74 is transmitted to a connection member 76 via a force transmission mechanism 75. An example of the force transmission mechanism 75 is a ball screw mechanism, and converts the rotation of the servomotor 74 into linear motion in the upward/downward direction.

Figure 3:
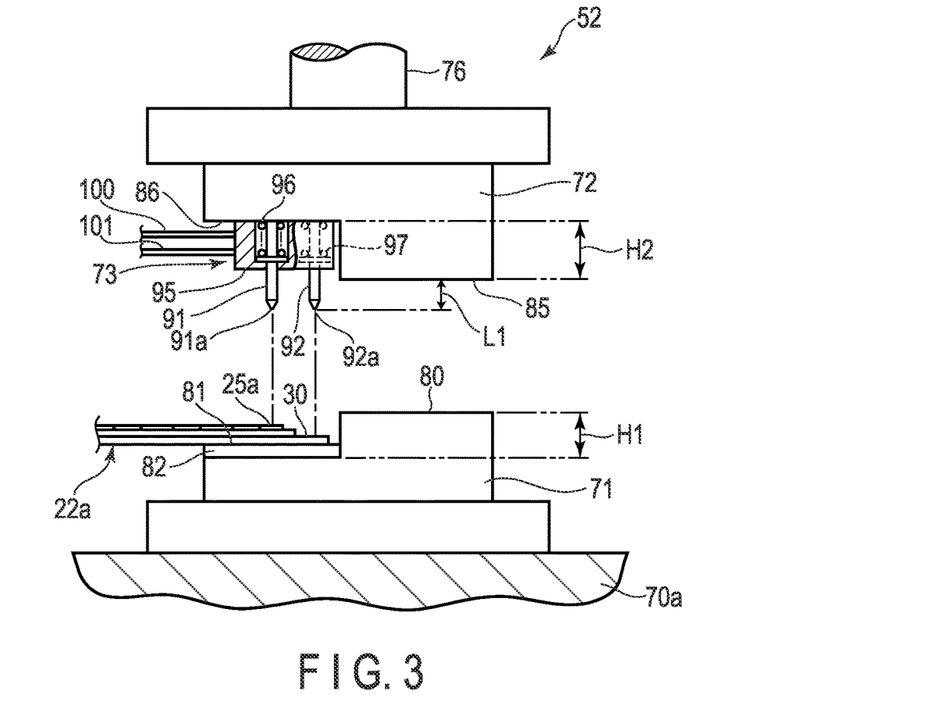
FIG. 3 is a side view partly in section showing a state where an upper jig of the jig unit shown in FIG. 2 is lifted.
Figure 4:
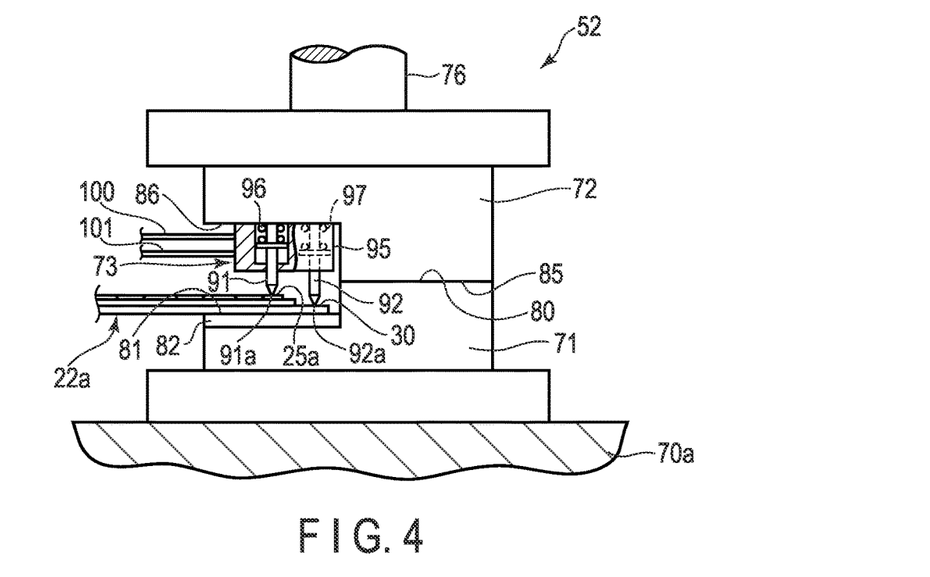
FIG. 4 is a side view partly in section showing a state where the upper jig of the jib unit shown in FIG. 2 is lowered.

FIG. 3 shows a state where the upper jig 72 has moved to the lifting stroke end. At this time, the upper jig 72 is separated from the lower jig 71. FIG. 4 shows a state where the upper jig 72 has moved to the lowering stroke end. At this time, the upper jig 72 and the lower jig 71 are in contact with each other. The lower jig 71 has a reference surface 80 and a workpiece placement surface 81. The reference surface 80 is made of a flat surface extending in the horizontal direction. The workpiece placement surface 81 is formed at a position lower by a height H1 than the reference surface 80.

A portion to be measured of the suspension 10 (for example, the tail pad portion 22a) is placed on the workpiece mounting surface 81. The workpiece placement surface 81 is made of a flat surface extending in the horizontal direction. Therefore, the reference surface 80 and the workpiece placement surface 81 are parallel to each other. The workpiece placement surface 81 is formed on the upper surface of an insulating member 82 having electrical insulation properties such as resin or ceramic.

The upper jig 72 has an abutting surface 85 and a probe mounting surface 86. The abutting surface 85 is opposed to the reference surface 80 of the lower jig 71. The probe mounting surface 86 is formed at a position higher by a height H2 than the abutting surface 85. The abutting surface 85 is made of a flat surface extending in the horizontal direction. The probe unit 73 is arranged on the probe mounting surface 86. The abutting surface 85 of the upper jig 72 extends in the horizontal direction parallel to the reference surface 80. When the upper jig 72 moves to the lowering stroke end, the reference surface 80 and the abutting surface 85 abut each other and make surface contact with each other.

The probe unit 73 includes a first probe 91 and the second probe 92. These probes 91 and 92 are arranged above the workpiece placement surface 81. Distal ends 91a and 92a of the probes 91 and 92 project toward the workpiece placement surface 81, respectively.

FIG. 3 shows a state where the upper jig 72 is separated from the lower jig 71. The distal ends 91a and 92a of probes 91 and 92 project downward by a length L1 from the abutting surface 85 of the upper jig 72, respectively. Note that it is also possible to include other probes in addition to the first probe 91 and the second probe 92.

The first probe 91 is arranged above a specific terminal 25a to be measured. The specific terminal 25a is one of the terminals 25 of the tail pad portion 22a. When the first probe 91 is lowered, the first probe 91 can contact the specific terminal 25a. The specific terminal 25a is an example of the first contact portion which the first probe 91 contacts. The second probe 92 is arranged above the metal base 30 of the tail pad portion 22a. When the second probe 92 is lowered, the second probe 92 can contact the metal base 30. The metal base 30 is an example of the second contact portion which the second probe 92 contacts.

The servomotor 74, the force transmission mechanism 75 and the connection member 76 constitute a lifting/lowering mechanism 77. The lifting/lowering mechanism 77 lowers the upper jig 72 toward the lower jig 71 by the torque of the servomotor 74. The lifting/lowering mechanism 77 has a function of causing the first probe 91 and the second probe 92 to contact the first contact portion and the second contact portion of the portion to be measured, respectively. In addition, the lifting/lowering mechanism 77 also has a function of causing the abutting surface 85 to abut the reference surface 80.

The first probe 91 and the second probe 92 can move in the upward/downward direction with respect to a probe case 95. The first probe 91 is urged downward by a first spring 96 accommodated in the probe case 95. The second probe 92 is urged downward by a second spring 97 accommodated in the probe case 95.

FIG. 4 shows a state where the abutting surface 85 of the upper jig 72 has lowered to a position at which the abutting surface 85 contacts the reference surface 80 (the lowering stroke end). While the upper jig 72 is being lowered to the lowering stroke end, the distal end 91a of the first probe 91 abuts the terminal 25a. Simultaneously, the first spring 96 is compressed according to the height of the terminal 25a. Therefore, the first probe 91 maintains electrical contact with the terminal 25a under a state where the first spring 96 is compressed. In addition, while the upper jig 72 is being lowered to the lowering stroke end, the distal end 92a of the second probe 92 abuts the metal base 30. Simultaneously, the second spring 97 is compressed according to the height of the metal base 30. Therefore, the second probe 92 maintains electrical contact with the metal base 30 under a state where the second spring 97 is compressed.

The first probe 91 and the second probe 92 are connected to the control unit 53 via conductive lines 100 and 101, respectively. The control unit 53 measures the insulation resistance of the portion to be measure by processing electrical outputs detected by the probes 91 and 92. Information about the measured insulation resistance is stored in the memory, etc., of the control unit 53 and is displayed on the display unit 54 as needed.

The servomotor 74 is rotated by electrical power and generates a torque. The rotation of the servomotor 74 is converted into linear motion by the force transmission mechanism 75, and accordingly, the upper jig 72 is moved in the upward/downward direction. That is, the upper jig 72 can relatively move in the upward/downward direction with respect to the lower jig 71. The servomotor 74 is controlled by the control unit 53. The control unit 53 has a means of electrically detecting the magnitude of the torque based on the electrical power supplied to the servomotor 74.

Figure 5:
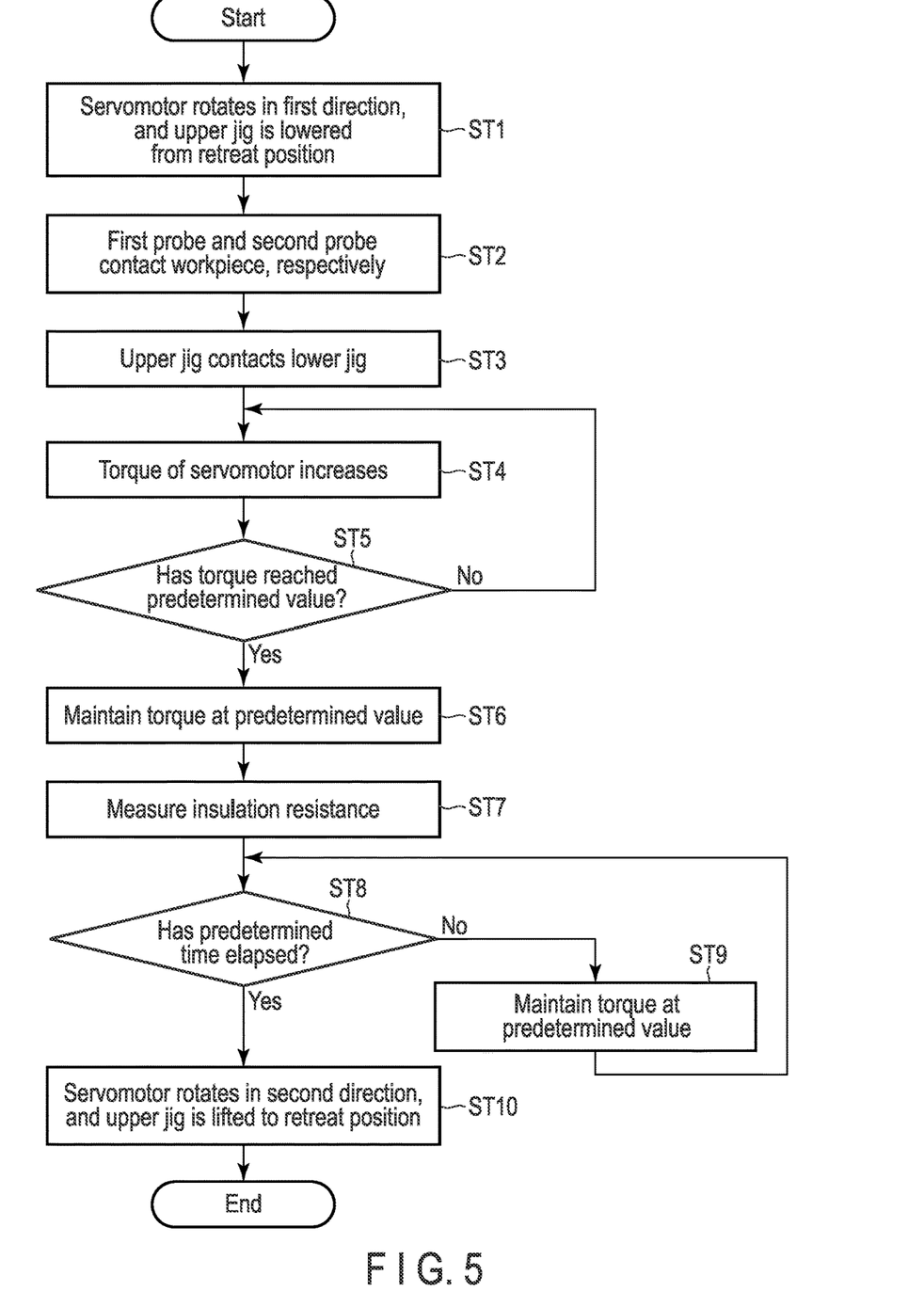
FIG. 5 is a flowchart showing a processing flow of the insulation resistance measurement device shown in FIG. 1.
Figure 6:
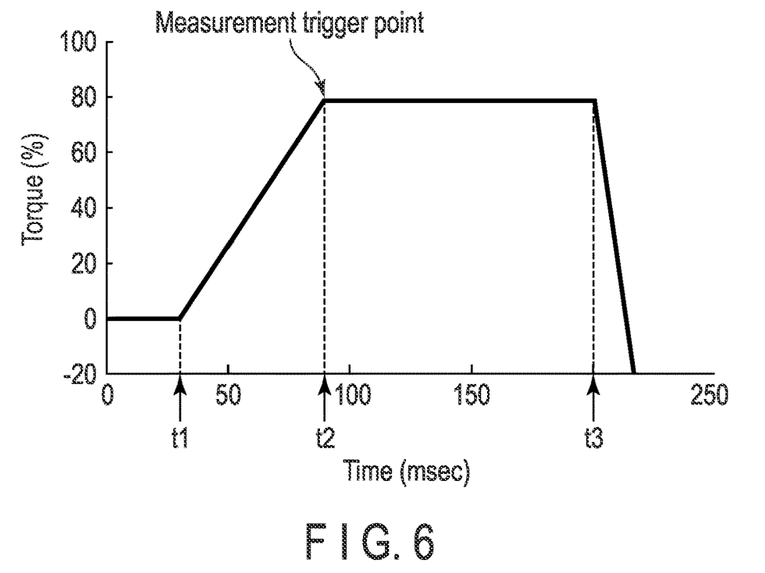
FIG. 6 is an illustration showing the relationship between an operation elapsed time and a torque of a servomotor of the insulation resistance measurement device shown in FIG. 1.

The effect of the insulation resistance measurement device 50 of the present embodiment will be described with reference to FIGS. 5 to 7. FIG. 5 is a flowchart showing the effect of the insulation resistance measurement device 50. FIG. 6 shows the relationship between the time elapsed from the start of the operation of the servomotor 74 (the horizontal axis) and the torque (the vertical axis).

In step ST1 in FIG. 5, the rotation of the servomotor 74 starts. The servomotor 74 rotates in the first direction. Accordingly, the upper jig 72 moves from the retreat position (the lifting stroke end) toward the lower jig 71. In step ST2, while the upper jig 72 is being lowered toward the lower jig 71, the distal end 91a of the first probe 91 abuts the terminal 25a. In addition, the distal end 92a of the second probe 92 abuts the metal base 30.

Figure 7:
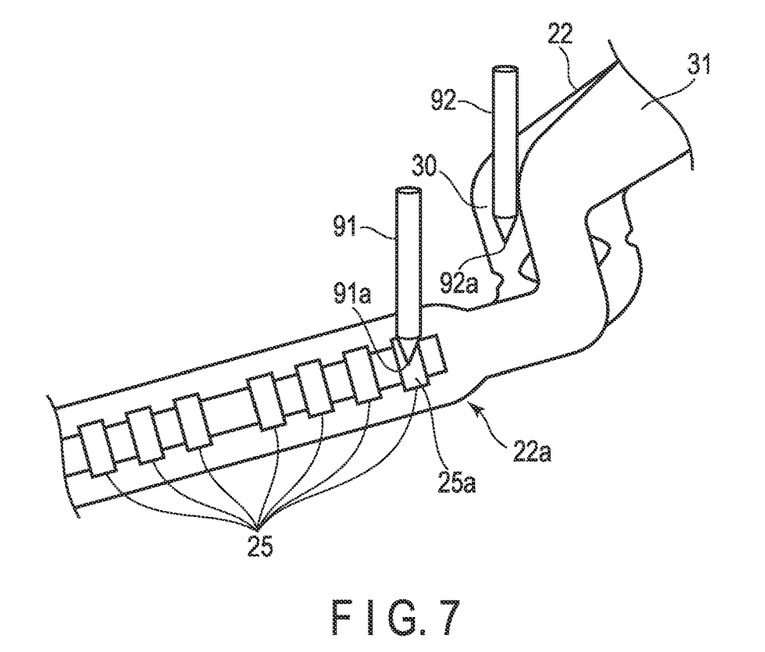
FIG. 7 is a perspective view schematically showing probes of the insulation resistance measurement device shown in FIG. 1 and a part of a suspension.

FIG. 7 schematically shows a part of the tail pad portion 22a and the probes 91 and 92. As shown in FIG. 7, the distal end 91a of the first probe 91 abuts the specific terminal 25a of the tail pad portion 22a. When the distal end 91a of the first probe 91 abuts the terminal 25a, the first spring 96 is compressed as shown in FIG. 4. The first probe 91 remains at a constant height. Therefore, the first probe 91 maintains contact with the terminal 25a under an appropriate contact pressure by a repulsive load of the first spring 96.

As shown in FIG. 7, the distal end 92a of the second probe 92 abuts the metal base 30 of the tail pad portion 22a. When the distal end 92a of the second probe 92 abuts the metal base 30, the second spring 97 is compressed as shown in FIG. 4. The second probe 92 remains at a constant height. Therefore, the second probe 92 maintains contact with the metal base 30 under an appropriate contact pressure by a repulsive load of the second spring 97.

When the upper jig 72 further is lowered, in step ST3 in FIG. 5 (time t1 in FIG. 6), the abutting surface 85 of the upper jig 72 abuts the reference surface 80 of the lower jig 71. Even after the abutting surface 85 abuts the reference surface 80, the supply of electrical power to the servomotor 74 continues. Therefore, the servomotor 74 tries to continue rotating. However, since the abutting surface 85 abuts the reference surface 80, the upper jig 72 apparently remains stopped at the height.

Therefore, from the time t1 shown in FIG. 6, the torque of the servomotor 74 starts increasing gradually (step ST4 in FIG. 5). Then, the pressurizing force of the upper jig 72 with respect to the lower jig 71 increases. Although the apparent height of the upper jig 72 does not change, the torque of the servomotor 74 increases. In step ST5, whether or not the torque has reached a predetermined value (measurement trigger point) is determined.

At time t2 in FIG. 6, when the torque reaches the predetermined value (measurement trigger point), step ST5 is "YES" and the processing proceeds to step ST6. In step ST6, the servomotor 74 is controlled by the control unit 53 such that the servomotor 74 maintains a predetermined torque (an 80% torque in the example of FIG. 7). The control unit 53 controls the electrical power (at least one of voltage and current) supplied to the servomotor 74. Therefore, the pressurizing force of the upper jig 72 with respect to the lower jig 71 is maintained, and this state is maintained until time t3 in FIG. 6. At this time, the first probe 91 remains electrically contacting the terminal 25a. The second probe 92 remains abutting the metal base 30.

In step ST7 in FIG. 5, the insulation resistance is measured from the time t2 until the time t3 in FIG. 6. The first probe 91 is in contact with the specific terminal 25a. The second probe 92 is in contact with the metal base 30. Therefore, an electrical insulation resistance between a conductive portion conductive to the specific terminal 25a and the metal base 30 used as an electrical ground is measured. Although a time required for measurement is short, the length from the time t2 to the time t3 is set longer than the required measurement time.

For example, in a state where voltage is applied between the first probe 91 and the second probe 92, a leakage current between the conductive portion conductive to the terminal 25a and the metal base 30 is detected. The insulation resistance is obtained by the control unit 53 based on the magnitude of the detected leakage current. Data about the insulation resistance obtained in this way is stored in the memory, etc., of the control unit 53 and is displayed or the display unit 54 as needed.

In step ST8 in FIG. 5, whether or not a predetermine time has elapsed (whether or not it has reached the time t3) is determined. If it has not reached the time t3 ("NO" in step ST8), the torque is maintained in step ST9, and the processing returns to step ST8. If the predetermined time has elapsed ("YES" in step ST8), the processing proceeds to step ST10. In step ST10, the servomotor 74 rotates in the second direction. Accordingly, after the time t3, the upper jig 72 is lifted, and consequently, the upper jig 72 is separated from the lower jig 71. Finally, the upper jig 72 returns to the retreat position (the lifting stroke end) shown in FIG. 3.

As described above, the insulation resistance measurement method of the present embodiment includes the steps of:

(1) placing the tail pad portion 22a of the suspension chain blank 40 as the workpiece on the workpiece placement surface 81 of the lower jig 71 of the jig unit 52 disposed on the measurement stage 51;

(2) lowering the upper jig 72 in which the first probe 91 and the second probe 92 are arranged toward the tail pad portion 22a as the portion to be measured by the servomotor 74 of the lifting/lowering mechanism 77;

(3) causing the distal end 91a of the first probe 91 to abut the first contact portion of the portion to be measured (for example, the terminal 25a of the tail pad portion), and urging the first probe 91 toward the first contact portion by the first spring 96;

(4) causing the distal end 92a of the second probe 92 to abut the second contact portion of the portion to be measured (for example, the metal base 30), and urging the second probe 92 toward the second contact portion by the second spring 97;

(5) lowering the upper jig 72 further by the servomotor 74 in a state where the probes 91 and 92 abut the first contact portion and the second contact portion, respectively;

(6) causing the abutting surface 85 of the upper jig 72 to abut the reference surface 80 of the lower jig 71;

(7) increasing the torque of the servomotor 74 in a state where the abutting surface 85 abuts the reference surface 80; and (8) measuring, when the torque reaches a predetermined value, the insulation resistance of the portion- to be measured by the probes 91 and 92 in a state where the torque is maintained.

According to the measurement device 50 of the present embodiment, the abutting surface 85 of the upper jig 72 abuts the reference surface 80 of the lower jig 71, and consequently, the relative positions of the lower jig 71 and the upper jig 72 are maintained. In this state, the electrical contact of the first probe 91 and the first contact portion (for example, the terminal 25a) is maintained under a constant contact pressure by the repulsive load of the first spring 96. In addition, the electrical contact of the second probe 92 and the second contact portion (for example, the metal base 30) is maintained under a constant contact pressure by the repulsive load of the second spring 97.

Therefore, probing for measurement can be efficiently carried out on the production line of the suspension 10. In addition, the contact pressures of the probes 91 and 92 are stabilized, it becomes less likely to be affected by a change in humidity, variations in shape, a degree of deformation and the like of the portion to be measured, and probing can be accurately carried out. Therefore, the insulation resistance can be more accurately measured, and the insulation properties of the electrical circuit including the wiring portion of the suspension 10 or the like can be appropriately evaluated.

The jig unit 52 of the present embodiment is formed such that the workpiece placement surface 81 of the lower jig 71 is formed of the insulating member 82 made of an electrically insulating material. Therefore, mixing of electrical noise which causes variations in measurement value in a measurement signal through the lower jig 71 is suppressed, and measurement accuracy can be further improved.

In the manufacturing process of the suspension 10, a die set including a lower die and an upper die is used for bending or cutting a part of the suspension 10 in some cases. The jig unit 52 of the present embodiment uses the lower die and the upper die of the die set used in the manufacturing process of the suspension 10 directly as the lower jig 71 and the upper jig 72 of the jig unit 52. Therefore, the cost of the jig unit 52 can be reduced. Furthermore, the relative positions of the lower jig 71 (lower die) and the upper jig 72 (upper die) can be defined highly accurately. Accordingly, the positioning accuracy of the probes 91 and 92 on the production line is high, and more accurate probing can be realized.

Needless to say, in carrying out the present invention, the respective elements constituting the insulation resistance measurement device can be variously modified. For example, the lower jig, the upper jig, the probe unit, the servomotor and the like can be various modified. The measurement object (workpiece) may be an electronic component other than the disk drive suspension. In addition, the portion to be measured may be other than the terminal of the tail pad portion and the metal base.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An insulation resistance measurement device which measures an insulation resistance of a portion to be measured of a workpiece comprising:
   a lower jig having a reference surface and a workpiece placement surface;
   an upper jig having an abutting surface opposed to the reference surface;
   a probe unit including a first probe and a second probe disposed in the upper jig and projecting toward the workpiece placement surface, and a first spring and a second spring which urge the probes downward;
   a lifting/lowering mechanism which includes a servomotor which lowers the upper jig toward the lower jig, and causes the probes to contact the portion to be measured and causes the abutting surface to abut the reference surface; and
   a control unit which measures, when a torque of the servomotor increases and reaches a predetermined value in a state where the probes contact the portion to be measured and the abutting surface abuts the reference surface, the insulation resistance of the portion to be measured by the probes in a state where the torque is maintained.

2. The insulation resistance measurement device of claim 1, wherein the workpiece comprises a suspension,
   wherein the insulation resistance measurement device further comprises a transfer mechanism which transfers a suspension chain blank in which a plurality of suspensions are arranged with a predetermined pitch,
   wherein the transfer mechanism includes an actuator which places a tail pad portion of one of the suspension suspensions on the workpiece placement surface.

3. The insulation resistance measurement device of claim 1, wherein the probe unit includes:
   the first probe, which contacts a first contact portion of the portion to be measured;
   the first spring, which urges the first probe downward;
   the second probe, which contacts a second contact portion of the portion to be measured; and
   the second spring, which urges the second probe downward, and
   wherein a distal end of the first probe abuts the first contact portion, a distal end of the second probe abuts the second contact portion, and the abutting surface abuts the reference surface in a state where the first spring and the second spring are compressed, respectively.

4. The insulation resistance measurement device of claim 1, wherein
the lower jig has the workpiece placement surface located at a lower position than the reference surface, and
the upper jig has a probe mounting surface located at a higher position than the abutting surface.

5. The insulation resistance measurement device of claim 1, wherein
the reference surface and the abutting surface are each formed of a flat surface extending in a horizontal direction, and
the reference surface and the abutting surface are parallel to each other.

6. An insulation resistance measurement method of measuring an insulation resistance of a portion to be measured of a workpiece comprising:
placing the portion to be measured of the workpiece on a workpiece placement surface of a lower jig disposed on a measurement stage;
lowering an upper jig including probes toward the portion to be measured by a servomotor;
causing distal ends of the probes to abut the portion to be measured;
urging the probes toward the portion to be measured by springs;
lowering the upper jig further by the servomotor in a state where the distal ends of the probes abut the portion to be measured;
causing an abutting surface of the upper jig to abut a reference surface of the lower jig;
increasing a torque of the servomotor in a state where the abutting surface abuts the reference surface; and
measuring, when the torque reaches a predetermined value, the insulation resistance of the portion to be measured by the probes in a state where the torque is maintained.

7. The insulation resistance measurement method of claim 6, wherein a lower die of a die set used for processing the workpiece is used as the lower jig, and an upper die of the die set is used as the upper jig.

* * * * *